(12) United States Patent
An et al.

(10) Patent No.: US 7,961,028 B2
(45) Date of Patent: Jun. 14, 2011

(54) SINGLE SUPPLY PASS GATE LEVEL CONVERTER FOR MULTIPLE SUPPLY VOLTAGE SYSTEM

(75) Inventors: Jiyeon An, Daegu (KR); Young Hwan Kim, Pohang-si (KR); Hyoun Soo Park, Daegu (KR)

(73) Assignee: Postech Academy-Industry Foundation, Pohang, Kyungsangbuk-do (KR)

( * ) Notice: Subject to any disclaimer, the term of this patent is extended or adjusted under 35 U.S.C. 154(b) by 0 days.

(21) Appl. No.: 12/639,188

(22) Filed: Dec. 16, 2009

(65) Prior Publication Data

US 2010/0156371 A1 Jun. 24, 2010

(30) Foreign Application Priority Data

Dec. 24, 2008 (KR) .................. 10-2008-0133840

(51) Int. Cl.
*H03L 5/00* (2006.01)
(52) U.S. Cl. .............. 327/333; 326/62; 326/81
(58) Field of Classification Search ............. 326/80–82, 326/52–63; 327/306, 333
See application file for complete search history.

(56) References Cited

U.S. PATENT DOCUMENTS

| | | | | |
|---|---|---|---|---|
| 6,023,183 | A * | 2/2000 | Cao et al. | 327/333 |
| 6,433,583 | B1 * | 8/2002 | Micheloni et al. | 326/80 |
| 7,336,100 | B2 | 2/2008 | Correale, Jr. et al. | |
| 7,652,505 | B2 * | 1/2010 | Kanzaki | 326/81 |
| 7,683,667 | B2 * | 3/2010 | Kim | 326/63 |

FOREIGN PATENT DOCUMENTS

| | | |
|---|---|---|
| KR | 2001-0058513 A | 7/2001 |
| KR | 10-00788356 B1 | 1/2008 |

OTHER PUBLICATIONS

K. Usami and M. Horowitz, "Clustered voltage scaling technique for low-power design," Proc. International Symposium on Low Power Design, Apr. 1995, pp. 3-8.
R. K. Krishnamurthy, A. Alvandpour, V. De, and S. Borkar, "High-performance and low-power challenges for sub-70nm microprocessor circuits," Proc. IEEE Custom Integrated Circuits Conference, May 2002, pp. 125-128.

(Continued)

*Primary Examiner* — Dinh T. Le
(74) *Attorney, Agent, or Firm* — Kile Park Goekjian Reed & McManus PLLC

(57) ABSTRACT

The present invention relates to a level converter used in a multiple supply voltage system that is required to design a low-power and high-performance semiconductor, and more particularly, to a single supply pass gate level converter (SPLC) for a multiple supply voltage system, which has low power consumption, operates at high speed, and uses only a single supply voltage. The SPLC includes an input data providing circuit unit which receives an input signal of a low supply voltage; a data inversion circuit unit which receives input data from the input data providing circuit unit and outputs inversed input data; a feedback circuit unit which is fed back by an output of the data inversion circuit unit; and a data output buffer which inverses an output of the data inversion circuit unit and outputs an inversed signal. The input data providing circuit unit, the data inversion circuit unit, the feedback circuit unit, and the data output buffer are all driven by a high supply voltage such that only a single supply voltage which is the high supply voltage is required.

6 Claims, 5 Drawing Sheets

OTHER PUBLICATIONS

K. Usami, M. Igarashi, F. Minami, T. Ishikawa, M. Kanazawa, M. Ichida, and K. Nogami, "Automated low-power technique exploiting multiple supply voltages applied to a media processor," IEEE J. Solid-State Circuits, Mar. 1998, vol. 33, No. 3, pp. 463-472.

F. Ishihara, F. Sheikh, and B. Nikolic, "Level conversion for dual-supply systems," IEEE Transation VLSI System, Feb. 2004, vol. 12, No. 2, pp. 185-195.

R. Puri, L. Stok, J. Cohn, D. Kung, D. Pan, D. Sylvester, A. Srivastava, and S. Kulkarni, "Pushing ASIC performance in a power envelope," Proc. 40th Design Automation Conference, Jun. 2003, pp. 788-793.

Korean Intellectual Property Office, Non-Final Rejection, Appln No. 10-2008-0133840, dated Sep. 16, 2010.

* cited by examiner

FIG. 7

| F/F | DELAY [ps] | POWER [uW] | PDP [fJ] | NUMBER OF TRANSISTORS | TOTAL WIDTH OF GATE [um] |
|---|---|---|---|---|---|
| PASS-TRANSISTOR HALF LATCH | 151.1 | 0.413 | 0.0624 | 6 | 0.9 |
| SSLC | 161.1 | 1.048 | 0.1690 | 6 | 3.19 |
| SPLC | 141.3 | 0.5888 | 0.0832 | 6 | 1.02 | ns # SINGLE SUPPLY PASS GATE LEVEL CONVERTER FOR MULTIPLE SUPPLY VOLTAGE SYSTEM

CROSS-REFERENCE TO RELATED PATENT APPLICATION

This application claims the benefit of Korean Patent Application No. 10-2008-0133840, filed on Dec. 24, 2008, in the Korean Intellectual Property Office, the disclosure of which is incorporated herein in its entirety by reference.

BACKGROUND OF THE INVENTION

1. Field of the Invention

The present invention relates to a level converter used in a multiple supply voltage system required to design a low-power and high-performance semiconductor, and more particularly, to a single supply pass gate level converter (SPLC) for a multiple supply voltage system, which has low power consumption, operates at high speed, and uses only a single supply voltage.

2. Description of the Related Art

A method of reducing a supply voltage in order to realize a low-power semiconductor integrated circuit is an efficient way of reducing power consumption and is disclosed in Reference 1 (R. K. Krishnamurthy, A. Alvandpour, V. De, and S. Borkar, "High-performance and low-power challenges for sub-70 nm microprocessor circuits," Proc. IEEE Custom Integrated Circuits Conference, May 2002, pp. 125-128). However, this method also reduces a speed of a system so that the overall performance of the system is reduced.

Thus, a multiple supply voltage system has been suggested in Reference 2 (K. Usami, M. Igarashi, F. Minami, T. Ishikawa, M. Kanazawa, M. Ichida, and K. Nogami, "Automated low-power technique exploiting multiple supply voltages applied to a media processor," IEEE J. Solid-State Circuits, March 1998, vol. 33, no. 3, pp. 463-472) in order to maintain the overall performance and to reduce the power consumption. This multiple supply voltage system is very efficient in reducing leakage power as well as dynamic power.

However, when data of a low supply voltage level drives a gate of a high supply voltage level, a p-channel metal oxide semiconductor (PMOS) transistor is not completely turned off and thus a static current flows therethrough, which is disclosed in Reference 3 (K. Usami and M. Horowitz, "Clustered voltage scaling technique for low-power design," Proc. International Symposium on Low Power Design, April 1995, pp. 3-8). In order to block a path of such a static current, a level converter that converts data of a low supply voltage level into data of a high supply voltage level should be necessarily used. Thus, an area, power, and delay of the level converter should be minimized in order to minimize an effect of adding the level converter. For this, the level converter is required to include a small number of transistors, have low power consumption, and operate at high speed. Also, the level converter is required to use only a single supply voltage in order to increase convenience in arranging the elements.

However, a pass-transistor half latch disclosed in Reference 4 (F. Ishihara, F. Sheikh, and B. Nikolic, "Level conversion for dual-supply systems," IEEE Transation VLSI System, February 2004, vol. 12, no. 2, pp. 185-195) and a single supply level converter (SSLC) disclosed in Reference 5 (R. Puri, L. Stok, J. Cohn, D. Kung, D. Pan, D. Sylvester, A. Srivastava, and S. Kulkarni, "Pushing ASIC performance in a power envelope," Proc. 40th Design Automation Conference, June 2003, pp. 788-793) and Reference 6 (U.S. Pat. No. 7,336,100 B2 (Anthony Correale, Rajiv V. Joshi, David S. Kung, Zhigang Pan, and Ruchir Puri) 2006, Aug. 23.), which are typical level converters, do not satisfy the above conditions.

That is, a level converter is required to include a small number of transistors, have low power consumption, operate at high speed, and use only a single supply voltage in order to minimize an effect of adding the level converter to a multiple supply voltage system and to increase convenience in arranging the elements. However, although a pass-transistor half latch that is a typical level converter has low power consumption and operates at high speed, the pass-transistor half latch uses two supply voltages, thereby leading to difficult arrangements. Although an SSLC that is another typical level converter uses a single supply voltage, the SSLC operates at low speed and has high power consumption. Other typical level converters have similar problems too.

In other words, since a level converter is necessarily used in a multiple supply voltage system, various level converters have been designed and typical level converters such as a cross-coupled PMOS pair level converter, an STR5, and a capacitive based level converter have been suggested in addition to the above-mentioned pass-transistor half latch and the SSLC.

Currently, some semiconductor circuits using the multiple supply voltage system use level converters.

SUMMARY OF THE INVENTION

The present invention provides a level converter for a multiple supply voltage system, which includes a small number of transistors, has low power consumption, operates at high speed, and uses only a single supply voltage, in order to minimize an effect of adding the level converter and to increase convenience in arranging the level converter.

The present invention also provides a level converter for a multiple supply voltage system, which has low power consumption, operates at high speed, and uses only a single supply voltage.

The present invention also provides a single supply pass gate level converter (SPLC) for a multiple supply voltage system, which has the advantages of a typical pass-transistor half latch having high performance characteristics and a typical single supply level converter (SSLC) using only a single supply voltage.

The present invention also provides a level converter in which an n-channel metal oxide semiconductor (NMOS) pass transistor of a typical pass-transistor half latch, which is driven by a low supply voltage, is replaced by a p-channel metal oxide semiconductor (PMOS) pass transistor that is driven by an input value, and which has high operation speed by always maintaining a forward body bias by coupling a body and source terminals of the PMOS pass transistor to each other.

According to an aspect of the present invention, there is provided a single supply pass gate level converter (SPLC) used in a multiple supply voltage system, the SPLC including an input data providing circuit unit which receives an input signal of a low supply voltage; a data inversion circuit unit which receives input data from the input data providing circuit unit and outputs inversed input data; a feedback circuit unit which is fed back by an output of the data inversion circuit unit; and a data output buffer which inverses an output of the data inversion circuit unit and outputs an inversed signal, wherein the input data providing circuit unit, the data inversion circuit unit, the feedback circuit unit, and the data output buffer are all driven by a high supply voltage such that only a single supply voltage which is the high supply voltage may be required.

The input data providing circuit unit may include a p-channel metal oxide semiconductor (PMOS) pass transistor.

A gate of the PMOS pass transistor of the input data providing circuit unit may be bounded to the input signal such that the PMOS pass transistor may be turned on or off by the input signal.

A forward body bias may be always maintained by coupling a body and source terminals of the PMOS pass transistor of the input data providing circuit unit so as to improve an operation speed.

The data inversion circuit unit may be an inverter including an n-channel metal oxide semiconductor (NMOS) transistor and a PMOS transistor, and the NMOS transistor may be turned on or off by the input signal and the PMOS transistor is turned on or off by an output value of the input data providing circuit unit, such that an inversed input signal having a converted level may be output.

The feedback circuit unit may include a PMOS transistor which is fed back by an output value of the data inversion circuit unit so as to be turned on or off, and, if the PMOS transistor of the feedback circuit unit is turned on, the high supply voltage which is an applied voltage may be input to the data inversion circuit unit such that the PMOS transistor of the data inversion circuit unit may be completely turned off.

The data output buffer may be an inverter, receives the output value of the data inversion circuit unit, and outputs the inversed signal.

If the input signal is at a logic low level ('0'), the NMOS transistor of the data inversion circuit unit may be turned off and the PMOS pass transistor of the input data providing circuit unit may be turned on, so that a voltage value of a PMOS transistor threshold voltage may be output, the voltage value may be input to a gate of the PMOS transistor of the data inversion circuit unit which is driven by the high supply voltage, if the PMOS transistor threshold voltage operates at a completely logic low level, the PMOS transistor of the data inversion circuit unit may be completely turned on such that an output of the data inversion circuit unit may reach the high supply voltage, if the PMOS transistor threshold voltage does not operate at the completely logic low level, the PMOS transistor of the data inversion circuit unit may be weakly turned on such that the output of the data inversion circuit unit may slowly reach the high supply voltage in comparison to a case when the PMOS transistor threshold voltage operates at the completely logic low level, a period of time until an output reaches a high supply voltage may be determined according to whether a transistor operates at a completely logic low level, which may be dependent upon an applied voltage and a threshold voltage of a corresponding circuit, and a high supply voltage value may operate at a logic high level ('1'), be input to a gate of the PMOS transistor of the feedback circuit unit, turn off the PMOS transistor of the feedback circuit unit, be inversed through the data output buffer, and be ultimately output as a logic low level value.

If the input signal is at the logic high level, that is, if the input signal is identical to a low supply voltage value, the NMOS transistor of the data inversion circuit unit may be turned on, and the PMOS pass transistor of the input data providing circuit unit may be weakly turned on because the PMOS pass transistor is driven by the high supply voltage, a sum of the low supply voltage and the PMOS transistor threshold voltage may be applied to the data inversion circuit unit such that the PMOS transistor of the data inversion circuit unit may be also weakly tuned on, in order to prevent a leakage current caused when the PMOS transistor and the NMOS transistor of the data inversion circuit unit are all turned on, a 0V signal which is obtained by rapidly pulling down the NMOS transistor of the data inversion circuit unit may turn on the PMOS transistor of the feedback circuit unit, and the high supply voltage may be applied to the gate of the PMOS transistor of the data inversion circuit unit so as to cut off a current path, the 0V signal which is pulled down in the data inversion circuit unit may be inversed through the data output buffer and an ultimate output value may be a high supply voltage value which is a logic high level value having a converted level.

BRIEF DESCRIPTION OF THE DRAWINGS

The above and other features and advantages of the present invention will become more apparent by describing in detail exemplary embodiments thereof with reference to the attached drawings in which:

FIG. 7 is a table for performance comparison when an SPLC according to an embodiment of the present invention, and a pass-transistor half latch and an SSLC which are typical level converters have minimum power-delay products (PDPs).

DETAILED DESCRIPTION OF THE INVENTION

A single supply pass gate level converter (SPLC) used in a multiple supply voltage system, according to the present invention, receives an input signal of a low supply voltage level and outputs an output signal of a high supply voltage level. The SPLC uses a single supply voltage, operates at high speed, and has low power consumption.

Hereinafter, the SPLC according to the present invention will be described in detail by explaining embodiments of the invention with reference to the attached drawings.

Figure 1:
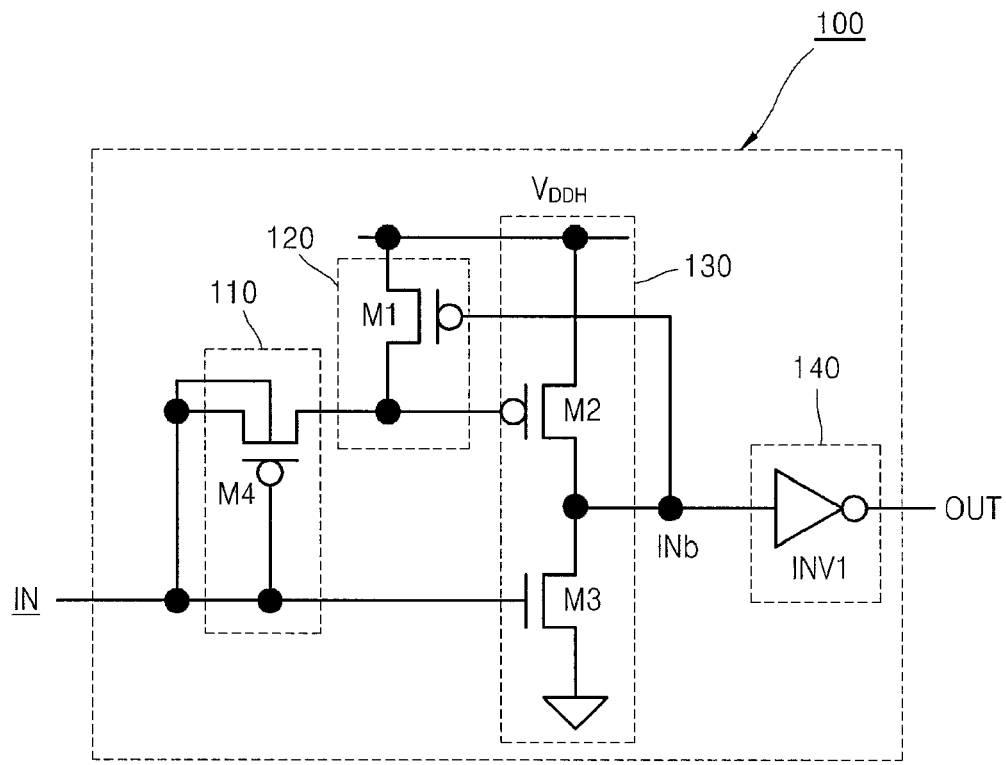
FIG. 1 is a circuit diagram of a single supply pass gate level converter (SPLC) according to an embodiment of the present invention.

FIG. 1 is a circuit diagram of an SPLC 100 according to an embodiment of the present invention.

Referring to FIG. 1, the SPLC 100 includes an input data providing circuit unit 110, a feedback circuit unit 120, a data inversion circuit unit 130, and a data output buffer 140, which are all driven by a high supply voltage. Thus, the SPLC 100 requires only a single supply voltage, that is, the high supply voltage.

In FIG. 1, IN represents a low supply voltage signal and each of INb and OUT represents a high supply voltage signal having a converted level.

A PMOS pass transistor M4 of the input data providing circuit unit 110 receives an input signal IN of a low supply voltage and provides the input signal IN to a gate of a PMOS transistor M2 of the data inversion circuit unit 130.

A PMOS transistor M1 of the feedback circuit unit 120 is fed back by an output value of the data inversion circuit unit 130 so as to be turned on or off. If the PMOS transistor M1 is turned on, the high supply voltage that is an applied voltage is input to the data inversion circuit unit 130 so that the PMOS transistor M2 of the data inversion circuit unit 130 is turned off.

The data inversion circuit unit 130 is an inverter including an n-channel metal oxide semiconductor (NMOS) transistor M3 and the PMOS transistor M2. The NMOS transistor M3 is turned on or off by the input signal IN and the PMOS transistor M2 is turned on or off by an output value of the input data providing circuit unit 110, thereby outputting an inversed input signal INb having a converted level.

The data output buffer 140 is an inverter INV1, receives the output value of the data inversion circuit unit 130, and outputs an inversed signal OUT.

Operation of the SPLC 100 will now be described.

If the input signal IN is at a logic low level ('0'), the NMOS transistor M3 of the data inversion circuit unit 130 is turned off, the PMOS pass transistor M4 of the input data providing circuit unit 110 is turned on, and thus a voltage value |Vtp| of a PMOS transistor threshold voltage Vtp is output. The voltage value |Vtp| is input to the gate of the PMOS transistor M2 of the data inversion circuit unit 130 that is driven by the high supply voltage. In this case, if the PMOS transistor threshold voltage Vtp operates at a completely logic low level, the PMOS transistor M2 is completely turned on such that an output of the data inversion circuit unit 130 reaches the high supply voltage. If the PMOS transistor threshold voltage Vtp does not operate at the completely logic low level, the PMOS transistor M2 is weakly turned on such that the output of the data inversion circuit unit 130 slowly reaches the high supply voltage, in comparison to a case when the PMOS transistor threshold voltage Vtp operates at the completely logic low level. As such, a period of time until an output reaches a high supply voltage may be determined according to whether a transistor operates at a completely logic low level, which is dependent upon an applied voltage and a threshold voltage of a corresponding circuit. Such a high supply voltage value operates at a logic high level ('1'), is input to a gate of the PMOS transistor M1 of the feedback circuit unit 120, turns off the PMOS transistor M1, is inversed through the data output buffer 140, and is ultimately output as a logic low level value.

If the input signal IN is at the logic high level, that is, if the input signal IN is identical to a low supply voltage value, the NMOS transistor M3 of the data inversion circuit unit 130 is turned on, and the PMOS pass transistor M4 of the input data providing circuit unit 110 is weakly turned on because the PMOS pass transistor M4 should be driven by the high supply voltage. As such, a sum of the low supply voltage and the PMOS transistor threshold voltage (VDDL+|Vtp|) is applied to the data inversion circuit unit 130 such that the PMOS transistor M2 of the data inversion circuit unit 130 is also weakly tuned on. Thus, in order to prevent a leakage current caused when the PMOS transistor M2 and the NMOS transistor M3 of the data inversion circuit unit 130 are all turned on, a 0V signal that is obtained by rapidly pulling down the NMOS transistor M3 turns on the PMOS transistor M1 of the feedback circuit unit 120. As such, the high supply voltage is applied to the gate of the PMOS transistor M2 of the data inversion circuit unit 130 so as to cut off a current path. The 0V signal that is pulled down in the data inversion circuit unit 130 is inversed through the data output buffer 140 and an ultimate output value is a high supply voltage value, that is, a logic high level value having a converted level.

Figure 2:
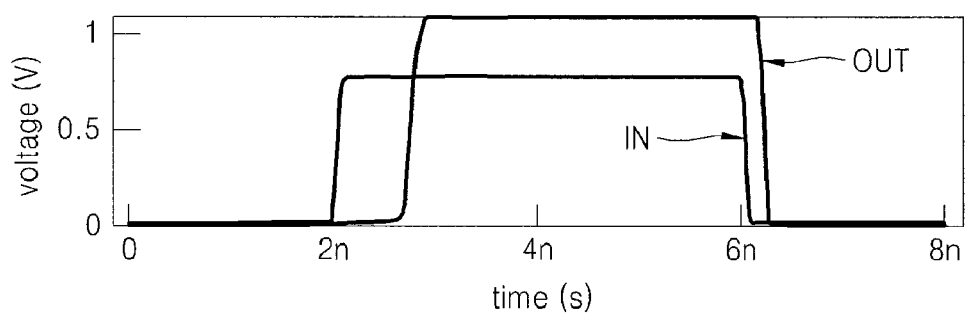
FIG. 2 is a graph showing waveforms of an SPLC according to an embodiment of the present invention, which are obtained by using a simulation program with integrated circuit emphasis (SPICE)

FIG. 2 is a graph showing waveforms of an SPLC according to an embodiment of the present invention, which are obtained by using a simulation program with integrated circuit emphasis (SPICE), that is, an electronic circuit analysis program initially developed by University of California, Berkeley, in 1972. In the SPICE simulation, a high supply voltage is 1.1V and a low supply voltage is 0.77V.

Figure 3:
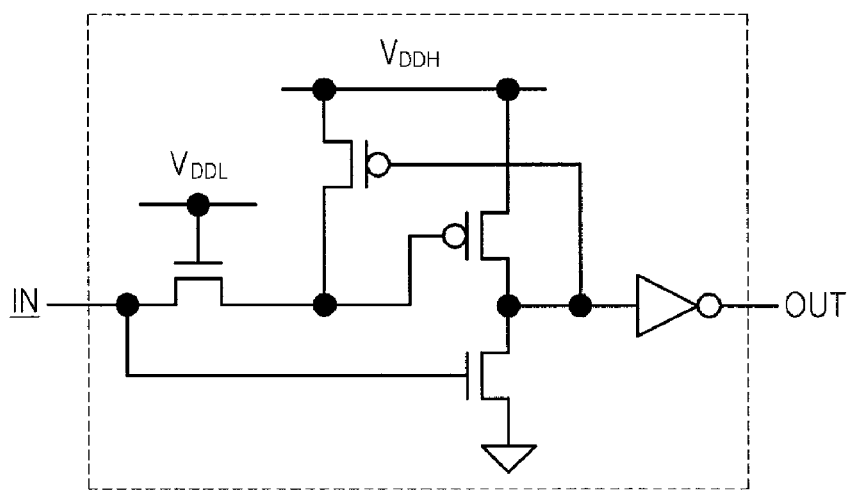
FIG. 3 is a circuit diagram of a pass-transistor half latch that is a typical level converter.
Figure 4:
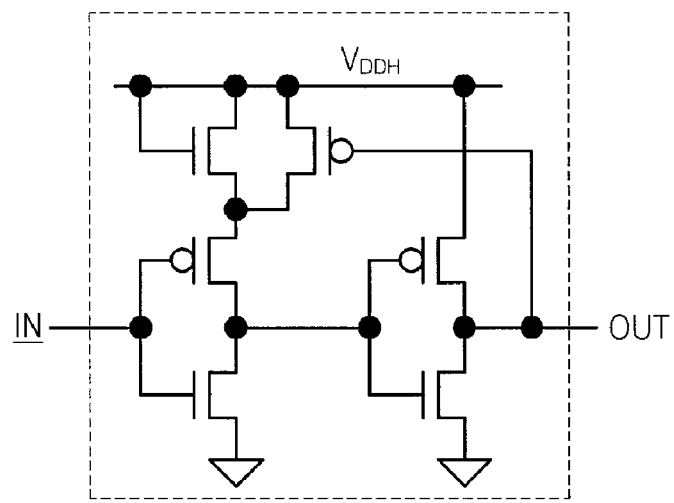
FIG. 4 is a circuit diagram of a single supply level converter (SSLC) including a total of six transistors, which is a typical level converter.
Figure 5:
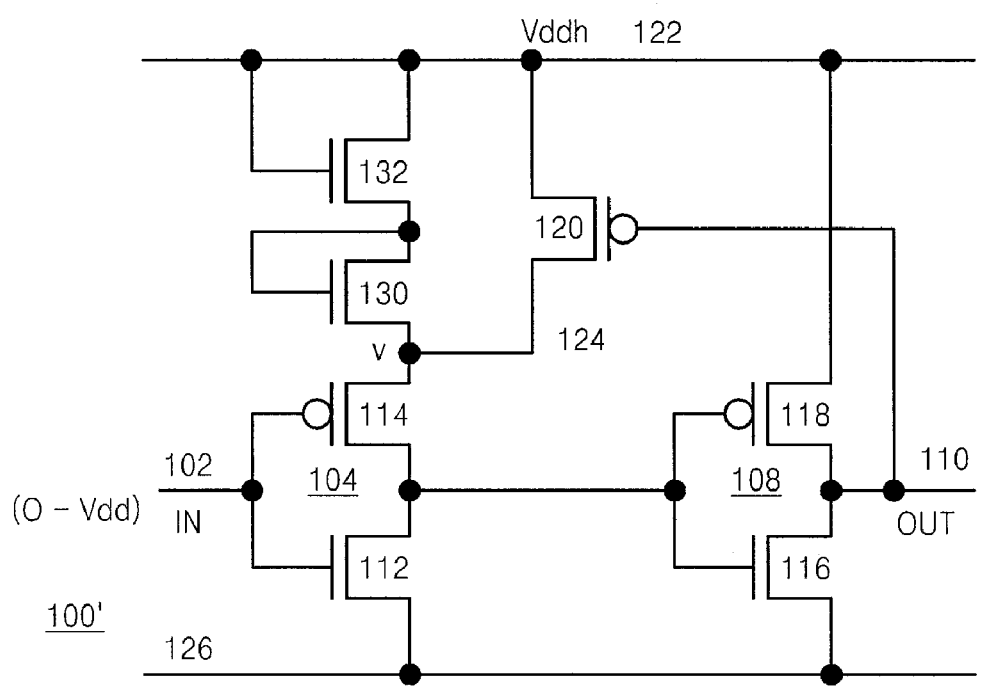
FIG. 5 is a circuit diagram of an SSLC including a total of seven transistors, which is a typical level converter.

FIG. 3 is a circuit diagram of a pass-transistor half latch that is a typical level converter. FIG. 4 is a circuit diagram of a single supply level converter (SSLC) including a total of six transistors, which is a typical level converter. FIG. 5 is a circuit diagram of an SSLC including a total of seven transistors, which is a typical level converter.

Although the pass-transistor half latch illustrated in FIG. 3 uses two supply voltages (VDDL and VDDH), the SPLC uses only a single supply voltage (VDDH). As a large number of driving supply voltages are used, a level converter has a complicated arrangement. Thus, the SPLC has high convenience in arranging elements.

Also, although a single supply voltage (VDDH or Vddh) is used, the SSLCs illustrated in FIGS. 4 and 5 transmit signals at low speed and have high power consumption. On the other hand, the SPLC has superior performance characteristics compared to the SSLCs by using a single supply voltage, increasing a signal transmission speed, and reducing power consumption.

Figure 6:
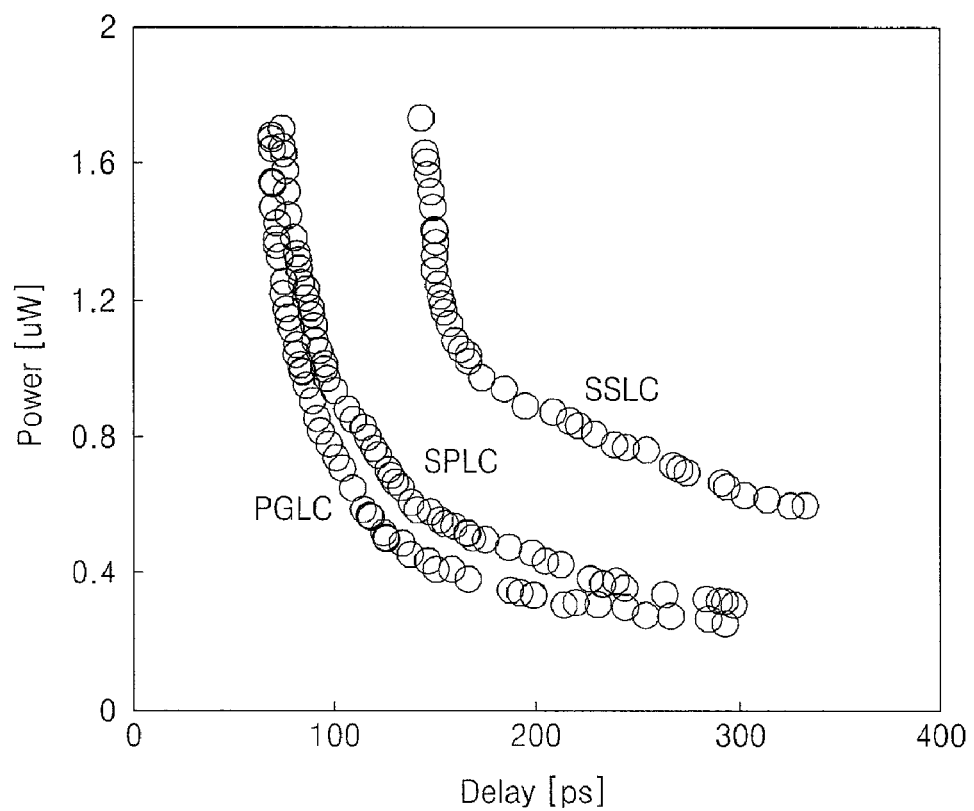
FIG. 6 is a graph showing operation regions of an SPLC according to an embodiment of the present invention, and a pass-transistor half latch and an SSLC which are typical level converters, with regard to power and delay.

FIGS. 6 and 7 show the results of a test for comparing performances and areas of an SPLC according to an embodiment of the present invention, and a pass-transistor half latch and an SSLC which are typical level converters, under various conditions as described below.

A high supply voltage is 1.1V, a low supply voltage is 0.77V, and a load capacitance of a level converter is 22 fF. A simulation is performed at 25° C., and a process model for an HSPICE simulation is a predictive technology model of 65 nm. The SSLC is one of the typical level converters and includes a total of six transistors.

As described above, an SPLC according to the present invention includes a total of six transistors such as two PMOS transistors and two inverters. Since only a single supply voltage is used, the SPLC has high convenience in arranging elements. For this, an NMOS pass gate of a pass-transistor half latch that is a typical level converter is replaced by a PMOS pass gate. Also, the SPLC provides a high operation speed by always maintaining a forward body bias by coupling body and source terminals of the PMOS pass gate to each other.

A level converter according to the present invention may be used in a semiconductor circuit system that uses multiple supply voltages.

An SPLC that is a single supply pass gate level converter according to the present invention has a similar performance to a typical pass-transistor half latch and has convenience in arranging elements in comparison to the pass-transistor half latch because only a single supply voltage is used.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A single supply pass gate level converter (SPLC) used in a multiple supply voltage system, the SPLC comprising:

an input data providing circuit unit which receives an input signal of a low supply voltage;

a data inversion circuit unit which receives input data from the input data providing circuit unit and outputs inversed input data;

a feedback circuit unit which is fed back by an output of the data inversion circuit unit; and a data output buffer which inverses an output of the data inversion circuit unit and outputs an inversed signal, wherein the input data providing circuit unit, the data inversion circuit unit, the feedback circuit unit, and the data output buffer are all driven by a high supply voltage such that only a single supply voltage which is the high supply voltage is required, wherein the input data providing circuit unit comprises a p-channel metal oxide semiconductor (PMOS) pass transistor, wherein a gate of the PMOS pass transistor of the input data providing circuit unit is bounded to the input signal such that the PMOS pass transistor is turned on or off by the input signal, and wherein a forward body bias is always maintained by coupling a body and source terminals of the PMOS pass transistor of the input data providing circuit unit so as to improve an operation speed.

2. The SPLC of claim 1, wherein the data inversion circuit unit is an inverter comprising an n-channel metal oxide semiconductor (NMOS) transistor and a PMOS transistor, and wherein the NMOS transistor is turned on or off by the input signal and the PMOS transistor is turned on or off by an output value of the input data providing circuit unit, such that an inversed input signal having a converted level is output.

3. The SPLC of claim 2, wherein the feedback circuit unit comprises a PMOS transistor which is fed back by an output value of the data inversion circuit unit so as to be turned on or off, and wherein, if the PMOS transistor of the feedback circuit unit is turned on, the high supply voltage which is an applied voltage is input to the data inversion circuit unit such that the PMOS transistor of the data inversion circuit unit is completely turned off.

4. The SPLC of claim 3, wherein the data output buffer is an inverter, receives the output value of the data inversion circuit unit, and outputs the inversed signal.

5. The SPLC of claim 3, wherein, if the input signal is at a logic low level ('0'), the NMOS transistor of the data inversion circuit unit is turned off and the PMOS pass transistor of the input data providing circuit unit is turned on, so that a voltage value of a PMOS transistor threshold voltage is output, wherein the voltage value is input to a gate of the PMOS transistor of the data inversion circuit unit which is driven by the high supply voltage, wherein, if the PMOS transistor threshold voltage operates at a completely logic low level, the PMOS transistor of the data inversion circuit unit is completely turned on such that an output of the data inversion circuit unit reaches the high supply voltage, wherein, if the PMOS transistor threshold voltage does not operate at the completely logic low level, the PMOS transistor of the data inversion circuit unit is weakly turned on such that the output of the data inversion circuit unit slowly reaches the high supply voltage in comparison to a case when the PMOS transistor threshold voltage operates at the completely logic low level, wherein a period of time until an output reaches a high supply voltage is determined according to whether a transistor operates at a completely logic low level, which is dependent upon an applied voltage and a threshold voltage of a corresponding circuit, and wherein a high supply voltage value operates at a logic high level ('1'), is input to a gate of the PMOS transistor of the feedback circuit unit, turns off the PMOS transistor of the feedback circuit unit, is inversed through the data output buffer, and is ultimately output as a logic low level value.

6. The SPLC of claim 5, wherein, if the input signal is at the logic high level, that is, if the input signal is identical to a low supply voltage value, the NMOS transistor of the data inversion circuit unit is turned on, and the PMOS pass transistor of the input data providing circuit unit is weakly turned on because the PMOS pass transistor is driven by the high supply voltage, wherein a sum of the low supply voltage and the PMOS transistor threshold voltage is applied to the data inversion circuit unit such that the PMOS transistor of the data inversion circuit unit is also weakly tuned on, wherein, in order to prevent a leakage current caused when the PMOS transistor and the NMOS transistor of the data inversion circuit unit are all turned on, a 0V signal which is obtained by rapidly pulling down the NMOS transistor of the data inversion circuit unit turns on the PMOS transistor of the feedback circuit unit, and wherein the high supply voltage is applied to the gate of the PMOS transistor of the data inversion circuit unit so as to cut off a current path, the 0V signal which is pulled down in the data inversion circuit unit is inversed through the data output buffer, and an ultimate output value is a high supply voltage value which is a logic high level value having a converted level.

* * * * *